(12) United States Patent
Yamauchi

(10) Patent No.: US 6,373,759 B2
(45) Date of Patent: Apr. 16, 2002

(54) SRAM DEVICE

(75) Inventor: Hiroyuki Yamauchi, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/823,102

(22) Filed: Mar. 30, 2001

(30) Foreign Application Priority Data

Mar. 31, 2000 (JP) ........................................ 2000-099788

(51) Int. Cl.$^7$ ................................................. G11C 7/00
(52) U.S. Cl. ........................ 365/200; 365/63; 365/156; 365/230.03
(58) Field of Search ............................. 365/200, 230.03, 365/230.06, 63, 154, 156

(56) References Cited

U.S. PATENT DOCUMENTS

| 5,920,514 A | 7/1999 | Lim et al. ..................... 365/200 |
| 6,246,614 B1 * | 6/2001 | Ooishi ......................... 365/191 |
| 6,295,618 B1 * | 9/2001 | Keeth .......................... 714/718 |

* cited by examiner

*Primary Examiner*—David Nelms
*Assistant Examiner*—Gene N. Auduong

(74) *Attorney, Agent, or Firm*—Michael K. Kelly; Snell & Wilmer, LLP

(57) ABSTRACT

An SRAM device includes: a plurality of normal memory blocks each including N normal memory cells for storing data, wherein N is a natural number; a spare memory block including one or more spare memory cells for storing data; a defective block setting section for storing first defective block information indicating a normal memory block including a defective normal memory cell among the plurality of normal memory blocks; N internal data lines which are respectively coupled to the N normal memory cells included in each of the plurality of normal memory blocks, where the N internal data lines are used for reading data stored in the N normal memory cells included in one of the plurality of normal memory blocks which is designated by access information, wherein the access information is externally input to the SRAM device; one or more spare data lines coupled to the spare memory block for reading data from the one or more spare memory cells included in the spare memory block; N external data lines via which the SRAM device outputs the data; and a coupling circuit for, depending on whether or not the first defective block information matches the access information, either coupling those of the N internal data lines which are not coupled to a defective normal memory cell in the normal memory block indicated by the first defective block information and at least one of the one or more spare data lines to the N external data lines, or coupling the N internal data lines to the N external data lines.

7 Claims, 6 Drawing Sheets

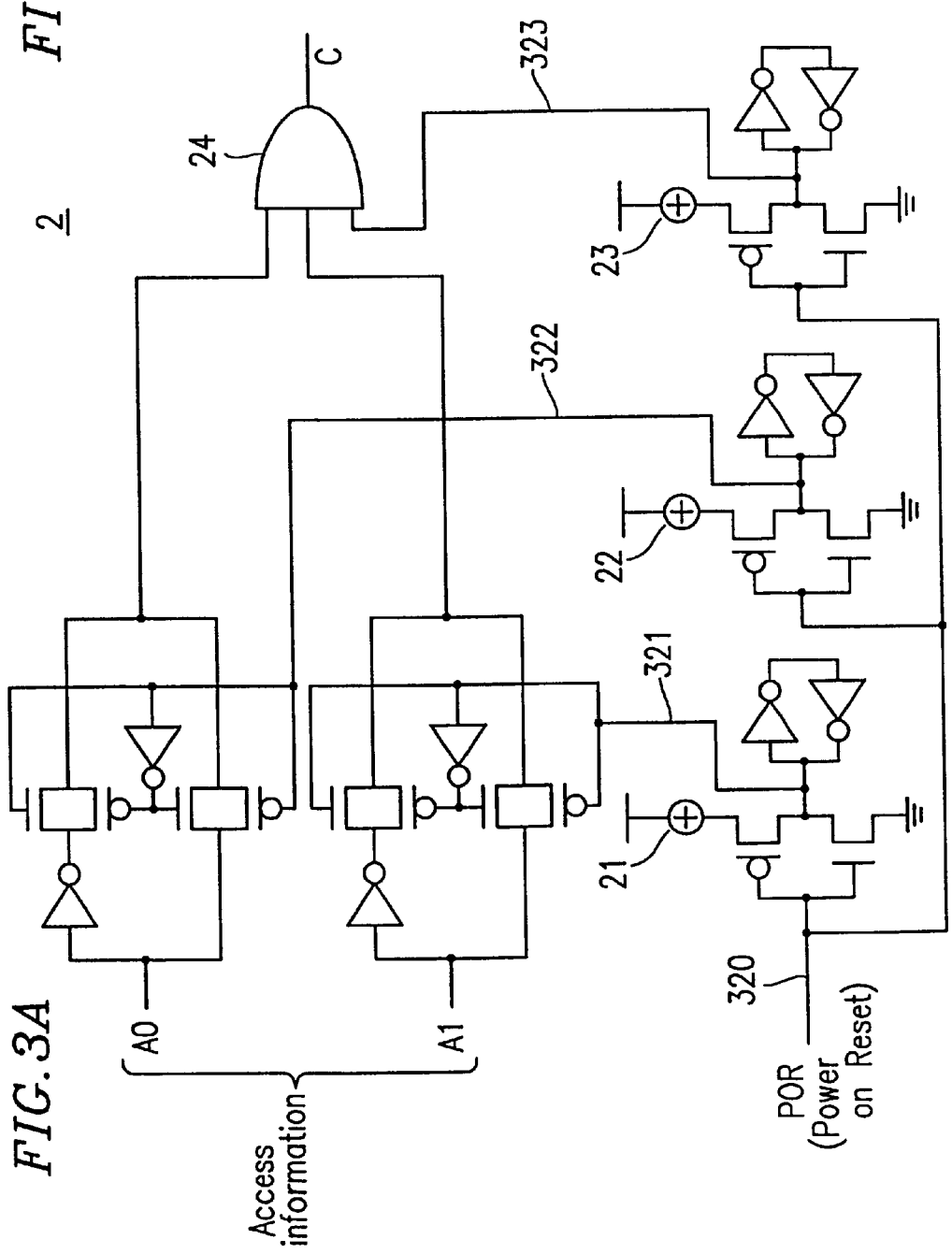

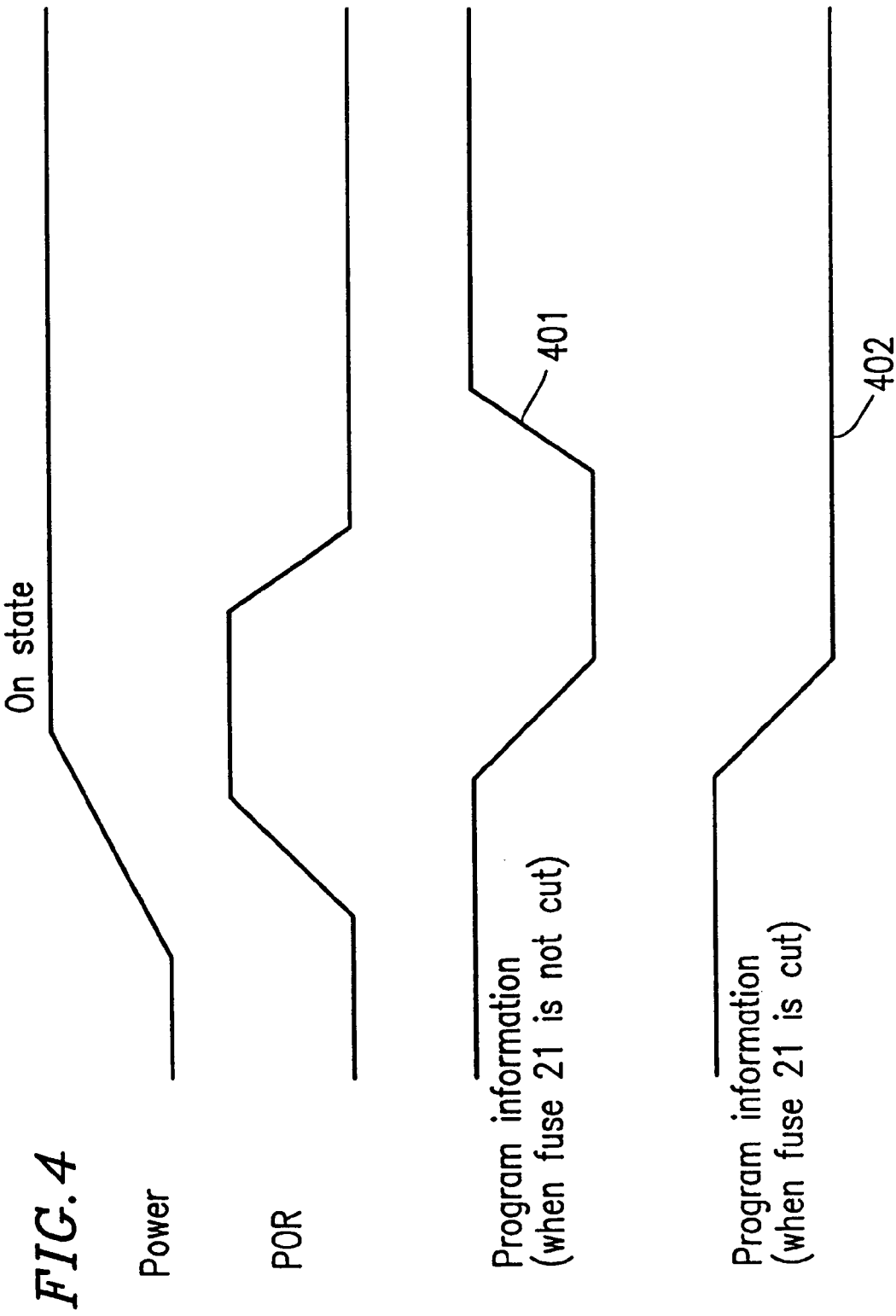

Main word line MWL — 201
Split word line selection line B1 — 202
B2 — 203
B3 — 204
Split word line 1 — 205
Split word line 2 — 206
Split word line 3 — 207
Spare word line — 208

Spare word line — 209
(in the case where block 2 is defective)

SRAM DEVICE

BACKGROUND OF THE INVENTION

1. Field of the Invention

The present invention relates to an SRAM (Static Random Access Memory) device including a redundant memory block (spare memory block).

2. Description of the Related Art

An SRAM device of a split word line type includes split word lines, such that only a number of memory cells (normal memory cells) are coupled to selected ones of the split word lines, where the number corresponds to a number N of bits in the I/O (input/output), thereby avoiding charging/discharging of bit lines associated with any unaccessed memory cells for the sake of power economy.

In large-capacity SRAM devices, it is essential to provide redundant memory cells (spare memory cells) for achieving a high production yield. Also, in SRAM devices which are produced by processes which are susceptible to a large defect density, it is essential to provide redundant memory cells (spare memory cells) for an improved production yield. This is the reason why redundant memory cells are incorporated in such SRAM devices.

Redundant memory cells need to be selected and activated simultaneously with normal memory cells. In the case where redundant memory cells are provided in an SRAM device of a split word line type, it is necessary to additionally provide and couple M redundant memory cells to each of the split word lines (where M is a natural number). Therefore, conventionally, a total of (N+M) memory cells, i.e., N normal memory cells and M redundant memory cells, are coupled to one split word line. It is also necessary to provide a selection circuit (coupling circuit) which, for each split memory block that corresponds to each split word line, selects N data lines from among the data lines corresponding to (N+M) bits. Such a selection circuit, which is typically implemented by employing non-volatile programming elements such as fuses, occupies a large area. This leads to a problem in that, when redundant memory cells are provided in an SRAM device of a split word line type, the overall area occupied by the SRAM device becomes large. A larger area being occupied by an SRAM device leads to a greater area penalty incurred by that SRAM device. As used herein, an "area penalty" for an SRAM device means an increased probability for the SRAM device to contain defects due to an increased area occupied by the SRAM device.

SUMMARY OF THE INVENTION

An SRAM device according to the present invention includes: a plurality of normal memory blocks each including N normal memory cells for storing data, wherein N is a natural number; a spare memory block including one or more spare memory cells for storing data; a defective block setting section for storing first defective block information indicating a normal memory block including a defective normal memory cell among the plurality of normal memory blocks; N internal data lines which are respectively coupled to the N normal memory cells included in each of the plurality of normal memory blocks, where the N internal data lines are used for reading data stored in the N normal memory cells included in one of the plurality of normal memory blocks which is designated by access information, wherein the access information is externally input to the SRAM device; one or more spare data lines coupled to the spare memory block for reading data from the one or more spare memory cells included in the spare memory block; N external data lines via which the SRAM device outputs the data; and a coupling circuit for, depending on whether or not the first defective block information matches the access information, either coupling those of the N internal data lines which are not coupled to a defective normal memory cell in the normal memory block indicated by the first defective block information and at least one of the one or more spare data lines to the N external data lines, or coupling the N internal data lines to the N external data lines.

In one embodiment of the invention, the defective block setting section further stores second defective block information indicating a defective normal memory cell among the N normal memory cells included in the normal memory block indicated by the first defective block information.

In another embodiment of the invention, the defective block setting section includes non-volatile programming means for storing the first defective block information and the second defective block information.

In still another embodiment of the invention, the spare memory block includes a spare word line which is coupled to at least one of the one or more spare memory cells included in the spare memory block; and the spare word line is activated independently from the access information.

In still another embodiment of the invention, the spare memory block includes a spare word line which is coupled to at least one of the one or more spare memory cells included in the spare memory block; and the spare word line is activated in accordance with the access information.

In still another embodiment of the invention, the coupling circuit couples those of the N internal data lines which are not coupled to the defective normal memory cell and the at least one of the one or more spare data lines to the N external data lines in a predetermined order.

In still another embodiment of the invention, the SRAM device further includes a main word line; each of the plurality of normal memory blocks further includes a split word line coupled to the N normal memory cells included in each of the plurality of normal memory blocks; and the split word line included in each of the plurality of normal memory blocks is coupled to the main word line.

Thus, the invention described herein makes possible the advantage of providing an SRAM device of a split word line type which incorporates redundant memory cells and which can reduce an area penalty associated therewith.

This and other advantages of the present invention will become apparent to those skilled in the art upon reading and understanding the following detailed description with reference to the accompanying figures.

BRIEF DESCRIPTION OF THE DRAWINGS

FIG. 3A is a circuit diagram illustrating a structure of a defective address comparison circuit 2.

FIG. 3B is a table showing a relationship between access information and normal memory blocks to be access ed.

FIG. 4 is a waveform diagram illustrating signal waveforms which appear on a wire 321 in the case where a fuse 21 is cut and in the case where a fuse 21 is not cut.

DESCRIPTION OF THE PREFERRED EMBODIMENTS

Hereinafter, the present invention will be described by way of illustrative examples, with reference to the accompanying figures.

Figure 1:
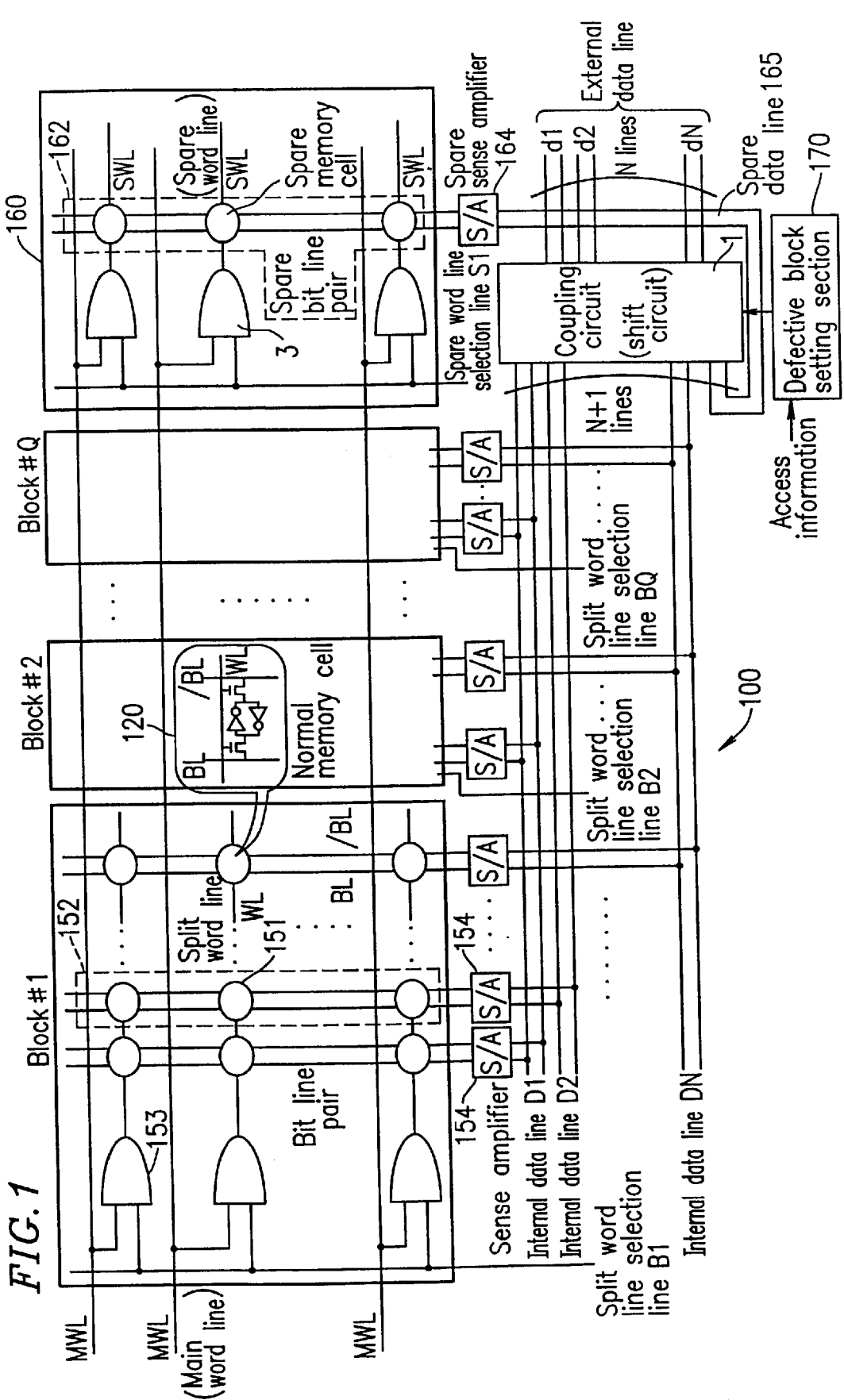
FIG. 1 is a block diagram illustrating an SRAM device 100 according to the present invention.

FIG. 1 shows a structure of the SRAM device 100 according to the present invention. The SRAM device 100 is an SRAM device of a split word line type, in which redundant memory cells are provided. The SRAM device 100 includes a plurality of memory blocks, namely: a number (Q) of normal memory blocks (block #1 to block #Q), each including a plurality of normal memory cells; and a spare memory block 160 including a plurality of spare memory cells.

The SRAM device 100 includes main word lines MWL, each of which is commonly coupled to a plurality of memory blocks (block #1 to block #Q and the block 160). Each of the plurality of normal memory blocks (block #1 to block #Q) includes split word lines WL. The spare memory block 160 includes spare word lines SWL.

Each of the plurality of split word lines WL included in the plurality of normal memory blocks (block #1 to block #Q) is coupled to a main word line MWL via an AND gate 153.

Each of the plurality of split word lines WL is selected by a corresponding main word line MWL and corresponding ones of split word line selection lines B1 to BQ. A spare word line SWL is selected by a main word line MWL and a spare word line selection line S1.

Usually, one of the split word line selection lines B1 to BQ can be selected by a decode signal, which is composed of several bits of a selection address for a memory cell. For example, if the SRAM device 100 includes four blocks (Q=4), one of the split word line selection lines B1 to B4 can be selected based on four possible bit patterns of a decode signal as represented by two bits (e.g., bits A0 and A1). Thus, bits A0 and A1 may be used as access information representing one of the plurality of normal memory blocks. The access information is externally input from outside of the SRAM device 100.

Each of the normal memory cells is composed of two transistors and two inverter circuits, such that the gates of the transistors are coupled to a split word line WL and the drains of the transistors are coupled to a pair of bit lines (BL, /BL). The spare memory cell has a similar structure to that of the normal memory cells. The structure of a single memory cell is shown in a magnified window 120 of FIG. 1. Based on this structure, each memory cell stores data therein.

N bits (where N is a natural number) of Bit line pairs (BL, /BL), which are used for reading information stored in N normal memory cells that are coupled to a selected split word line WL, are respectively coupled to N bits of internal data lines (D1 to DN), via a corresponding sense amplifier (S/A) 154. The internal data lines (D1 to DN) are shared across the plurality of normal memory blocks (block #1 to block #Q). As used herein, a split word line WL being "selected" means a split word line WL is raised to a predetermined potential (e.g., a HIGH level), i.e., activated. In the SRAM device 100, a split word line WL included in block #1, for example, can be selected when both a corresponding main word line MWL and the split word line selection line B1 transition to the predetermined potential.

To each spare word line SWL, M spare memory cells (i.e., at least one of the one or more memory cells in the spare memory block 160) are coupled (where M is a natural number).

M bits of spare bit line pairs, which are used for transferring information stored in M spare memory cells coupled to a spare word line SWL, are coupled to M bits of spare data lines 165 for the spare memory block 160 via a corresponding spare sense amplifier (S/A) 164. FIG. 1 illustrates a case where M=1, and the following description is directed to the case where M=1. Although the present invention is not limited to the M=1 configuration, substantial effects can be obtained in the SRAM device 100 having the M=1 configuration. In the case where M=1, there is an advantage in that the area penalty incurred by the SRAM device 100 can be minimized.

In the case where M=1, if one of the memory cells included in a plurality of normal memory blocks (block #1 to block #Q) is defective, a column including that defective memory cell is replaced by a column of the spare memory block. For example, if the memory cell 151 included in block #1 is defective, the entire column 152 including the memory cell 151 is replaced by a column 162 in the spare memory block 160.

The SRAM device 100 further includes a coupling circuit 1 which selects a predetermined number N of data lines from among a total of (N+M) data lines, i.e., N bits of internal data lines (D1 to DN) corresponding to the normal memory blocks (block #1 to block #Q) and M bits of data lines. corresponding to the spare memory block 160.

It is noted that, according to the terminology used in the present specification, the data lines are counted as follows: one bit of data line is considered as one data line, two bits of data lines are considered as two data lines, etc. For example, in FIG. 1, the internal data line D1 is actually composed of two wires which are respectively coupled to a bit line BL and a bit line /BL. However, these two wires, which cooperate so as to take care of one bit of data line, are regarded as one entity (a pair), and hence it will be said that "there is one internal data line D1".

Thus, the number N of internal data lines D1 to DN are respectively coupled to the N memory cells included in each of the plurality of normal memory blocks (block #1 to block #Q). The internal data lines D1 to DN read or write N bits of data to or from the N memory cells included in an accessed one of the plurality of normal memory blocks.

The spare data line 165, which is coupled to the spare memory block 160, reads data to or from at least one memory cell included in the spare memory block 160.

FIG. 1 illustrates a plurality of main word lines MWL. For example, there may be 256 main word lines MWL included in the SRAM device 100. However, only one main word line MWL may be included in the SRAM device 100. In the case where the SRAM device 100 includes only one main word line MWL, each normal memory block (e.g., block #1 shown in FIG. 1) includes N memory cells (normal memory cells). It will be appreciated that the SRAM device 100 may include any number (one or more) of main word lines MWL. Accordingly, each of the plurality of normal memory blocks (block #1 to block #Q) includes N memory cells. The spare memory block 160 includes one or more memory cells (spare memory cells).

If an accessed normal memory block (one of block #1 to block #Q) includes a defective memory cell(s) (as previously detected), coupling circuit 1 (shift circuit) isolates an internal data line(s) which accesses that defective memory cell(s) so that the internal data line(s) will not be selected, and replaces the isolated internal data line(s) with a corresponding number of spare data lines 165 associated with the spare memory block 160. Thus, it is guaranteed that N data lines will always be selected from among (N+M) data lines. The N selected data lines are respectively coupled to N external data lines d1 to dN. The N external data lines d1 to dN are provided in order to output to (or input from) the exterior of the SRAM device 100. For example, the external data lines d1 to dN may be coupled to an I/O buffer (not shown) provided external to the SRAM device 100.

Assuming, for example, that the memory cell 151 in block #1 in the example illustrated in FIG. 1 is a defective memory cell (i.e., a normal memory cell including a defect), when block #1 is accessed, the coupling circuit 1 isolates the internal data line D2 which is coupled to the memory cell 151. The coupling circuit 1 replaces the isolated number (=1) of internal data lines with a corresponding number of spare data lines 165 that are associated with the spare memory block 160, so that N data lines will always be selected from among (N+M) (i.e., (N+1) in this example) data lines. Thus, the selected N data lines (i.e., N−1 internal data lines and one spare data line) are respectively coupled to the N external data lines.

On the other hand, if the accessed normal memory block does not include any defective memory cells (i.e., if any of block #2 to block #Q is accessed in the example assumed), (N+M) (i.e., (N+1) in this example) data lines, the N data lines (D1 to DN) associated with the normal memory blocks are selected, while the M (i.e., one) spare data line 165 associated with the spare memory block 160 is not selected. In other words, the N internal data lines D1 to DN are respectively coupled to the N external data lines d1 to dN.

The above-described operation of the coupling circuit 1 is performed based on access information and defective block information (which includes first defective block information and second defective block information; to be described later) stored in a defective block setting section 170.

Figure 2:
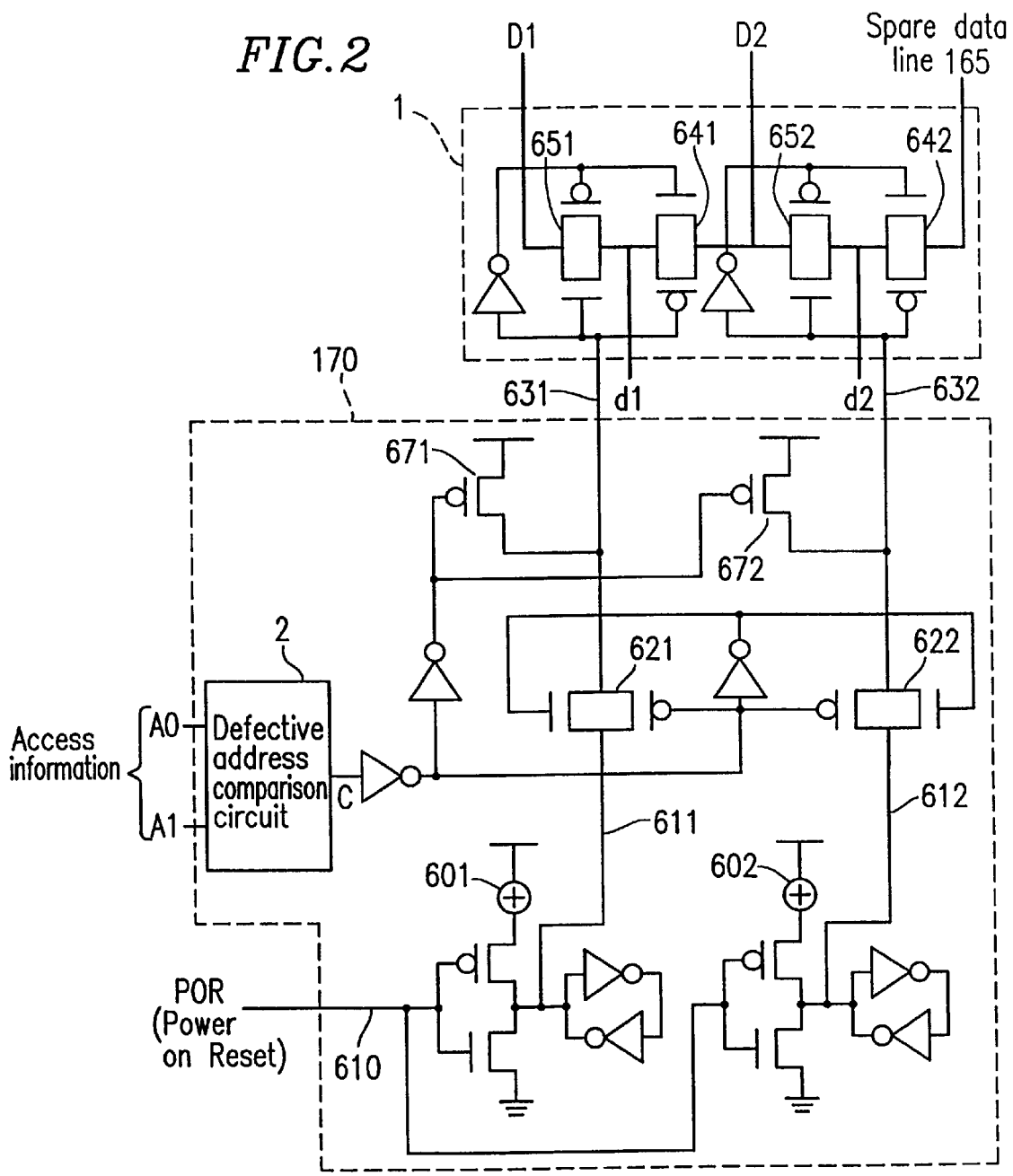
FIG. 2 is a circuit diagram illustrating a structure of a coupling circuit 1 and a defective block setting section 170 according to the present invention.

FIG. 2 is a circuit diagram illustrating a structure of the coupling circuit 1 and the defective block setting section 170. In FIG. 2, it is assumed that M=1 and N=2 for conciseness of explanation. Thus, in the exemplary structure illustrated in FIG. 2, two data lines will be selected from among three data lines (internal data lines D1 and D2 and the spare data line 165), and the selected data lines will be coupled to two external data lines (d1, d2).

The defective block setting section 170 includes a defective address comparison circuit 2. In the defective address comparison circuit 2, information (herein referred to as "first defective block information") indicating a normal memory block(s) which includes a defective memory cell(s), among the plurality of normal memory blocks (block #1 to block #Q), is stored. In the case where the access information represented by bits A0 and A1 points to a normal memory block including a defective memory cell (i.e., the access information matches the first defective block information), an output C from the defective address comparison circuit 2 is "1" (HIGH level). The specific structure of the defective address comparison circuit 2 will be described later with reference to FIG. 3.

A fuse 601 and a fuse 602 function to record second defective block information indicating a defective memory cell among the memory cells included in the normal memory block (defective memory block) indicated by the first defective block information.

For example, within the defective memory block, if a memory cell coupled to the internal data line D1 includes a defect, then the fuses 601 and 602 are both cut. A POR signal is input to a wire 610. The POR signal is a signal in which a HIGH level pulse occurs when the SRAM device 100 is turned ON. In the case where the fuses 601 and 602 are both cut, the wires 611 and 612 both transition to a LOW level when a pulse is applied to the wire 610 responsive to the activation of the SRAM device 100. Transfer gates 621 and 622 both become opened (i.e., conduct) when the access information matches the first defective block information stored in the defective address comparison circuit 2, i.e., when the defective memory block is to be accessed. When the transfer gates 621 and 622 are opened, the wires 631 and 632 both transition to the LOW level. As a result, the transfer gates 641 and 642 are opened, and the transfer gates 651 and 652 are closed. Accordingly, the internal data line D2 is coupled to the external data line d1, whereas the spare data line 165 is coupled to the external data line d2.

Similarly, within the defective memory block, if a memory cell coupled to the internal data line D2 includes a defect, then only the fuse 602 (and not the fuse 601) is cut. As a result, the internal data line D1 is coupled to the external data line d1, whereas the spare data line 165 is coupled to the external data line d2.

Thus, in the case where a defective memory block is to be accessed (i.e., the access information matches the first defective block information stored in the defective address comparison circuit 2), those of the N internal data lines (N=2 in the example illustrated in FIG. 2) which are not coupled to the defective memory cell, as well as the spare data line 165, are coupled to the N external data lines d1 and d2.

In the case where a non-defective memory block is to be accessed (i.e., the access information does not match the first defective block information stored in the defective address comparison circuit 2), the output C from the defective address comparison circuit 2 is "0" (LOW level). As a result, the transistors 671 and 672 are turned ON, so that the wires 631 and 632 transition to the HIGH level. The transfer gates 651 and 652 are opened, whereas the transfer gates 641 and 642 are closed. As a result, the internal data line D1 is coupled to the external data line d1, whereas the internal data line D2 is coupled to the external data line d2. In other words, the N internal data lines (D1 and D2) are coupled to the external data lines d1 and d2.

As described above, the coupling circuit 1 performs different operations depending on the access information. Specifically, the coupling circuit 1 is controlled so that the spare data line 165 is utilized (i.e., the spare data line 165 is coupled to one of the N external data lines) in the case where the output C from the defective address comparison circuit 2 is "1" (i.e., the block to be accessed includes a defective memory cell), although the spare data line 165 is not utilized in any other cases.

Moreover, among the N internal data lines, the coupling circuit 1 couples an internal data line(s) other than those coupled to a defective memory cell(s), as well as M (at least one) spare data lines, to the N external data lines in a predetermined order; this is called a shift operation. Herein, such a shift operation occurring "in a predetermined order" has the following meaning: Among the internal data line(s) other than those coupled to a defective memory cell(s) and the M (at least one) spare data lines, the data lines which are located more to the right in FIG. 2 are coupled to those external data lines which are located more to the right in FIG. 2. For example, assuming that the internal data line D2 and the spare data line 165 are to be coupled to the external data lines d1 and d2, the spare data line 165 will be coupled to the external data line d2 (because the lines 165 and d2 are located more to the right than D2 and d1, respectively, in FIG. 2), whereas the internal data line D2 will be coupled to the external data line d1. Thus, it will be appreciated that the "predetermined order" only refers to a spatial order (i.e., an order concerning spatial locations), rather than a time sequence in which the coupling operations are supposed to take place. According to the shift operation performed by the coupling circuit 1, there is an advantage in that the spatial order of the internal data line(s) which are not coupled to a defective memory cell(s) and the M (at least one) spare data lines is identical to the spatial order of their corresponding external data lines, so that the coupling wires do not need to intersect one another.

FIG. 3A is a circuit diagram illustrating a structure of the defective address comparison circuit 2. The defective address comparison circuit 2 illustrated in FIG. 3A is adapted to an embodiment of the SRAM device 100 including a number Q of normal memory blocks, where Q is four. The respective normal memory blocks (block #1 to #4) can be represented by upper two bits (A0 and A1) of the address which is input to the SRAM device 100. Information indicating which one of the four normal memory blocks (block #1 to #4) includes a defective memory cell is previously programmed by means of the fuses 21 and 22. Thus, the defective address comparison circuit 2 stores information (i.e., first defective block information) indicating which one of the plurality of normal memory blocks (block #1 to #4) includes a defective memory cell.

The defective address comparison circuit 2 determines whether or not a normal memory block to be accessed includes a defective memory cell, based on whether or not the access information as represented by A0 and A1 matches the first defective block information.

Information concerning bit A1 is programmed in the fuse 21. Information concerning bit A0 is programmed in the fuse 22. Information concerning use of redundancy is programmed in the fuse 23. As used herein the "information concerning use of redundancy" is information concerning whether or not the defective memory cell(s) in the SRAM device 100 is to be restored.

A POR signal is input to a wire 320. In response to the POR signal, after the SRAM device 100 is turned ON, the information indicating whether or not the fuse 21 has been cut (i.e., the program information of the fuse 21) appears on the wire 321.

FIG. 3B is a table showing a relationship between the access information and normal memory blocks to be accessed. For example, in the case where block #1 is to be accessed, access information (A0="0", A1="0") is externally input to the SRAM device 100.

FIG. 4 is a waveform diagram illustrating signal waveforms which appear on the wire 321 in the case where the fuse 21 is cut and in the case where the fuse 21 is not cut. A waveform 401 is a signal waveform which appears on the wire 321 in the case where the fuse 21 is not cut. A waveform 402 is a signal waveform which appears on the wire 321 in the case where the fuse 21 is cut. Thus, after the SRAM device 100 is turned ON, the programmed state (information of bit A1) of the fuse 21 is reflected on the wire 321. Similarly, the wires 322 and 323 shown in FIG. 3A reflect, respectively, the information of bit A0 and the information concerning use of redundancy.

By cutting the respective fuses, the programmed states of the programming elements 21 to 23 indicate "0". On the other hand, by not cutting the respective fuses, the programmed states of the programming elements 21 to 23 indicate "1".

For example, in the defective address comparison circuit 2 shown in FIG. 3A, the information of bit A1 may be programmed to "0" (by cutting the fuse 21); the information of bit A0 may be programmed to "0" (by cutting the fuse 22); and the information concerning use of redundancy may be programmed to "1" (by not cutting the fuse 23). In this case, the output C from a three-input AND circuit 24 can take the value "1" only when the access information indicates (A1= "1", A0="1"). That is, the output C from a three-input AND circuit 24 takes the value "1" only in the case where block #4 includes a defective memory cell and where block #4 is to be accessed. The first defective block information is represented by the bit-inversion of the programmed state of the fuse 22 and the bit-inversion of the programmed state of the fuse 21.

As described with reference to FIGS. 2 and 3A, the defective block setting section 170 includes the fuses 601 and 602 (FIG. 2) and the fuses 21 and 22 (FIG. 3A). The first defective block information and second defective block information are stored in these fuses. The fuses 601, 602, 21, and 22 may include a current fuse which can be cut by allowing a large current to flow through the fuse, a laser fuse which can be cut by the use of a laser light beam, or a laser fuse which can be programmed via laser irradiation from a high-resistance state (cut state) to a low-resistance state (non-cut state), or any other fuses. Any non-volatile programming means may be employed as each of the fuse 601, 602, 21 and/or 22.

Figures 5A, 5B:
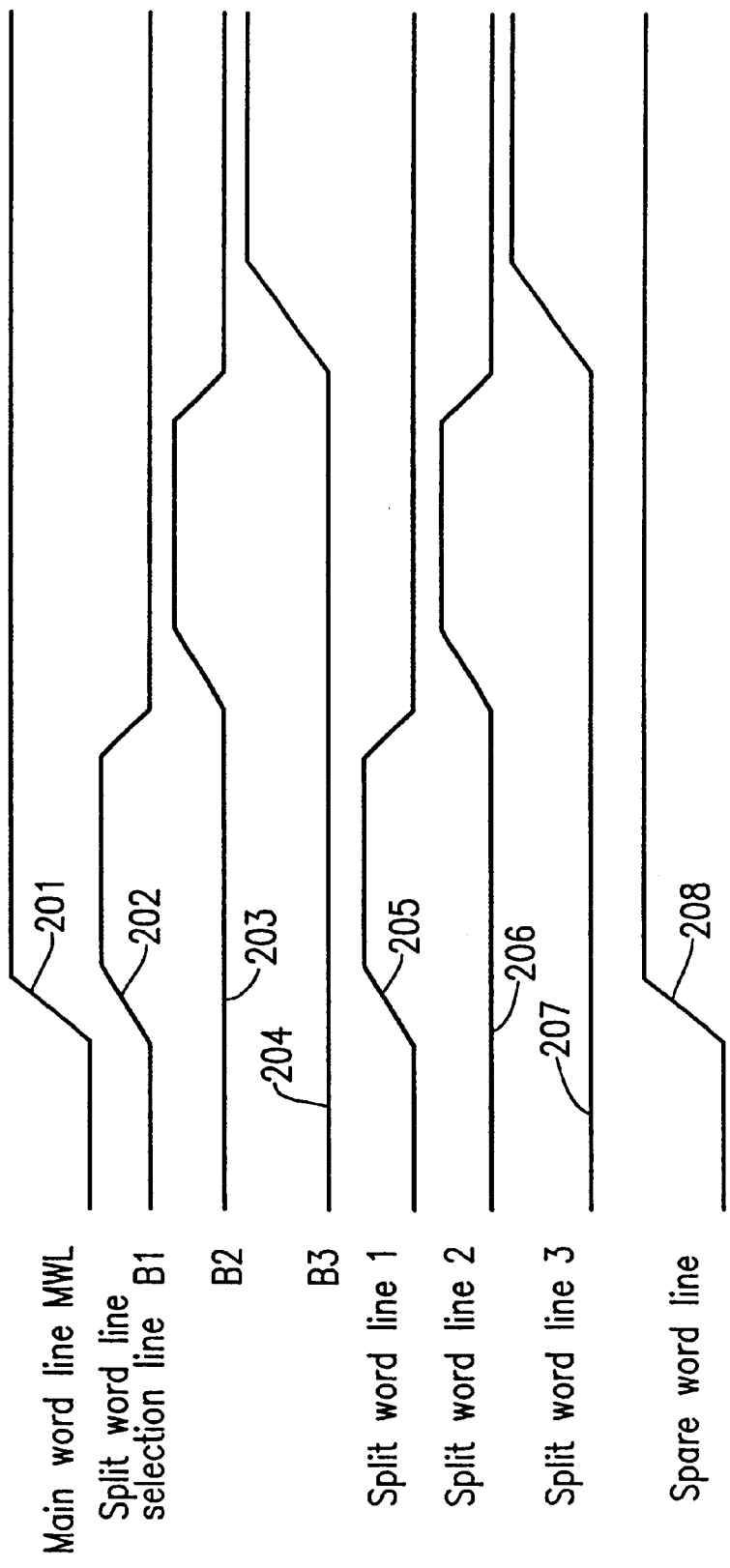
FIGS. 5A and 5B are waveform diagrams illustrating the operation timing of an SRAM device 100.

FIGS. 5A and 5B are waveform diagrams illustrating the operation timing of an SRAM device 100. As shown in FIG. 5A, a signal 201 on a main word line MWL and signals 202 to 204 on split word line selection lines Bn (i.e., B1, B2 and B3 in the example illustrated) activate corresponding split word lines (i.e., split word lines 1, 2, and 3 in the example illustrated; resulting in signals 205 to 207). In FIG. 5A, a raised portion of each signal waveform represents an activated state, whereas each level portion represents an inactivated state.

Each spare word line may be controlled so as to be activated (as exemplified by the signal 208 in FIG. 5A) with a similar timing to that of a main word line for the corresponding row, independently from the signals 202 to 204 on the split word line selection lines Bn (i.e., independently from the address of that split word line). Alternatively, each spare word line may be controlled so as to be activated (as exemplified by the signal 209 in FIG. 5B) when a split word line in a normal memory block which includes a defective memory cell is activated, in accordance with one of the signals 202 to 204 on the split word line selection lines Bn (i.e., signal 203 in the example illustrated in FIGS. 5A and 5B).

The spare word lines being activated with the timing of the signal 208 shown in FIG. 5A means that, whenever a main word line MWL is activated, a spare word line in the corresponding row is activated (selected). This can be achieved by ensuring that the spare word line selection line S1 shown in FIG. 1 is always maintained at "1" (HIGH level). In this case, irrespective of whether or not the normal memory block which is being accessed includes a defective memory cell (i.e., independently from the access information), each spare word line is selected (activated) concurrently with a main word line in the corresponding row. Table 1 illustrates a selection scheme for the spare word line selection line S1 in this case.

TABLE 1 each spare word line is activated
concurrently with a main word line in the corresponding row,
independently from the access information.

| Block including defective memory cell | | Spare word line selection line |
|---|---|---|
| None | S1 = 1 | S1: "1" (always selected) |
| #1 | S1 = 1 | S1: "1" (always selected) |
| #2 | S1 = 1 | S1: "1" (always selected) |
| #3 | S1 = 1 | S1: "1" (always selected) |
| . | . | . |
| . | . | . |
| . | . | . |
| #Q | S1 = 1 | S1: "1" (always selected) |

According to the selection scheme for the spare word line selection line S1 shown in Table 1, the spare word line selection line S1 in the SRAM device 100 shown in FIG. 1 is fixed at "1" under a constantly applied direct current. In this case, an advantage is provided in that problems associated with the timing adjustment between the normal memory blocks and the spare memory block can be eliminated since the number of gates which must be passed before an access to a memory cell can occur is identical between the normal memory blocks and the spare memory block.

Alternatively, the concurrent selection of the spare word line with a main word line in the corresponding row, which is made irrespective of whether or not the normal memory block being accessed includes a defective memory cell (i.e., independently from the access information), can be achieved by directly coupling each spare word line to a corresponding main word line, rather than providing the spare word line selection line S1 in the SRAM device 100.

Figure 6:
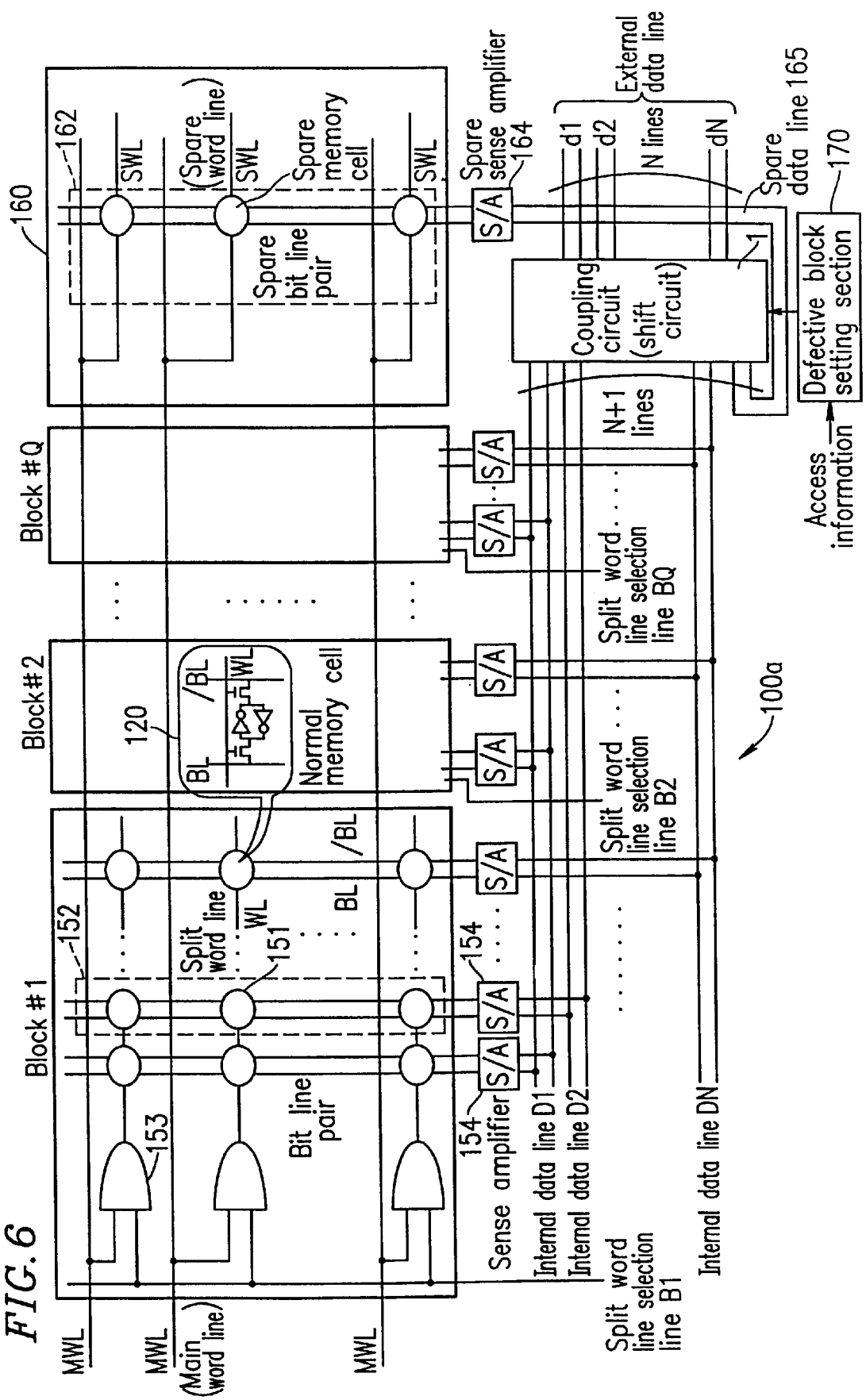
FIG. 6 is a block diagram illustrating a structure of an SRAM device 100a in which each spare word line is directly coupled to a corresponding main word line without providing a spare word line selection line S1.

FIG. 6 is a block diagram illustrating a structure of an SRAM device 100a in which each spare word line is directly coupled to a corresponding main word line, without providing a spare word line selection line S1 shown in FIG. 1. In FIG. 6, constituent elements which also appear in FIG. 1 are denoted by the same numerals as those used therein, and the associated description is omitted. A major difference between the SRAM device 100a and the SRAM device 100 shown in FIG. 1 is that the AND circuits 3 are omitted from the spare memory block 160 in the SRAM device 100a. In the SRAM device 100a, each spare word line SWL is directly activated by a main word line MWL in the corresponding row. Due to the omission of the AND circuits 3, the SRAM device 100a provides the advantage of a reduced area penalty relative to that incurred by the SRAM device 100.

The spare word lines being activated with the timing of the signal 209 shown in FIG. 5B means that a spare word line in a row corresponding to an activated main word line MWL is activated (selected) only when a normal memory block including a defective memory cell is accessed. This can be achieved by inputting a HIGH level signal to the spare word line selection line S1 when accessing a normal memory block including a defective memory cell, and by otherwise inputting a LOW level signal, in the SRAM device 100 shown in FIG. 1. For example, this can be achieved by inputting the output C from the defective address comparison circuit 2 (described with reference to FIG. 3A) to the spare word line selection line S1. In this case, the spare word lines are activated as necessary (i.e., depending on the address of each split word line). As a result, there is provided an advantage in that the power consumption is reduced relative to the case in which the spare word lines are activated with the timing of the signal 208 shown in FIG. 5A. Table 2 illustrates a selection scheme for the spare word line selection line S1 in this case.

TABLE 2 the spare word lines are activated in
accordance with access information (i.e., when a normal
memory block including a defective memory cell is accessed).

| Block including defective memory cell | | Spare word line selection line |
|---|---|---|
| None | S1 = 0 | S1: "0" (always unselected) |
| #1 | S1 = B1 | S1: selected if "B1" is selected; or unselected if "B1" is unselected |
| #2 | S1 = B2 | S1: selected if "B2" is selected; or unselected if "B2" is unselected |
| #3 | S1 = B3 | S1: selected if "B3" is selected; or unselected if "B3" is unselected |
| . | . | . |
| . | . | . |
| . | . | . |
| #Q | S1 = BQ | S1: selected if "BQ" is selected; or unselected if "BQ" is unselected |

Either one of the two schemes, i.e., the scheme in which the spare word lines are activated independently from the access information, or the scheme in which the spare word lines are activated in accordance with the access information, may be arbitrarily selected depending on whether a higher priority should be given to the reduction of the device area or operation timing, or to power economy.

In the case where a number M of spare data lines are coupled to the spare memory block 160 in the SRAM device 100 shown in FIG. 1 such that M is two or more, it is possible to restore the SRAM device 100 even if two or more columns of normal memory blocks (block #1 to block #Q) include a defective memory cell(s). In this case, M defective block setting sections 170 as illustrated in FIG. 2 are provided. In this case, each of the M defective block setting sections 170 stores first defective block information indicating one or more of a plurality of normal memory blocks (block #1 to block #Q) which includes a defective memory cell(s), as well as second defective block information indicating a memory cell which includes a defect among the memory cells in the normal memory block indicated by the first defective block information.

In general, for a given natural number M, when a defective memory block is to be accessed (i.e., the access information matches the first defective block information stored in the defective address comparison circuit 2), those of the N internal data lines which are not coupled to a defective memory cell(s) and at least one of the M (one or more) spare data lines are coupled to N external data lines.

As described above, according to an SRAM device of the present invention, first defective block information indicating at least one of a plurality of normal memory blocks which includes a defective memory cell(s) is stored in a defective block setting section. Depending on whether or not the first defective block information matches access information, a coupling circuit either couples those of N internal data lines which are not coupled to a defective memory cell(s) in a normal memory block indicated by the first defective block information and at least one of one or more spare data lines to N external data lines, or couples the N internal data lines to the N external data lines.

In the case where the coupling circuit couples those of the N internal data lines which are not coupled to a defective memory cell(s) in a normal memory block indicated by the first defective block information and at least one of the one or more spare data lines to the N external data lines, none of the internal data lines which are coupled to a defective memory cell(s) is coupled to the external data lines. Instead, at least one of the one or more spare data lines is coupled to an external data line. Thus, the defective memory cell(s) is replaced by a memory cell(s) within the spare memory block.

The memory cell(s) included in the spare memory block is used to replace a defective memory cell(s) included in a normal memory block indicated by the first defective block information. Irrespective of which one of the plurality of normal memory blocks includes a defective memory cell(s), the first defective block information pointing to that normal memory block may be stored in the defective block setting section, whereby the memory cells included in the spare memory block can be used to replace any defective memory cells in that normal memory block. Hence, it is unnecessary to provide a spare memory block for each normal memory block, or to provide a coupling circuit for each block. As a result, the area occupied by a single SRAM device can be decreased, thereby reducing the area penalty incurred by the SRAM device.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An SRAM device comprising:
    a plurality of normal memory blocks each including N normal memory cells for storing data, wherein N is a natural number;
    a spare memory block including one or more spare memory cells for storing data;
    a defective block setting section for storing first defective block information indicating a normal memory block including a defective normal memory cell among the plurality of normal memory blocks;
    N internal data lines which are respectively coupled to the N normal memory cells included in each of the plurality of normal memory blocks, where the N internal data lines are used for reading data stored in the N normal memory cells included in one of the plurality of normal memory blocks which is designated by access information, wherein the access information is externally input to the SRAM device;
    one or more spare data lines coupled to the spare memory block for reading data from the one or more spare memory cells included in the spare memory block;
    N external data lines via which the SRAM device outputs the data; and
    a coupling circuit for, depending on whether or not the first defective block information matches the access information, either coupling those of the N internal data lines which are not coupled to a defective normal memory cell in the normal memory block indicated by the first defective block information and at least one of the one or more spare data lines to the N external data lines, or coupling the N internal data lines to the N external data lines.

2. An SRAM device according to claim 1, wherein the defective block setting section further stores second defective block information indicating a defective normal memory cell among the N normal memory cells included in the normal memory block indicated by the first defective block information.

3. An SRAM device according to claim 2, wherein the defective block setting section comprises non-volatile programming means for storing the first defective block information and the second defective block information.

4. An SRAM device according to claim 1, wherein:
    the spare memory block comprises a spare word line which is coupled to at least one of the one or more spare memory cells included in the spare memory block; and
    the spare word line is activated independently from the access information.

5. An SRAM device according to claim 1, wherein:
    the spare memory block comprises a spare word line which is coupled to at least one of the one or more spare memory cells included in the spare memory block; and
    the spare word line is activated in accordance with the access information.

6. An SRAM device according to claim 1, wherein the coupling circuit couples those of the N internal data lines which are not coupled to the defective normal memory cell and the at least one of the one or more spare data lines to the N external data lines in a predetermined order.

7. An SRAM device according to claim 1, wherein:
    the SRAM device further comprises a main word line;
    each of the plurality of normal memory blocks further includes a split word line coupled to the N normal memory cells included in each of the plurality of normal memory blocks; and
    the split word line included in each of the plurality of normal memory blocks is coupled to the main word line.

* * * * *